US010175832B2

(12) United States Patent
Roziere (10) Patent No.: US 10,175,832 B2
(45) Date of Patent: Jan. 8, 2019

(54) SWITCHED-ELECTRODE CAPACITIVE-MEASUREMENT DEVICE FOR TOUCH-SENSITIVE AND CONTACTLESS INTERFACES (71) Applicant: QUICKSTEP TECHNOLOGIES LLC, Wilmington, DE (US)

(72) Inventor: Didier Roziere, Nimes (FR)

(73) Assignee: QUICKSTEP TECHNOLOGIES LLC, Wilmington, DE (US)

( * ) Notice: Subject to any disclaimer, the term of this patent is extended or adjusted under 35 U.S.C. 154(b) by 14 days.

(21) Appl. No.: 15/008,369

(22) Filed: Jan. 27, 2016

(65) Prior Publication Data
US 2016/0170533 A1 Jun. 16, 2016

Related U.S. Application Data (63) Continuation of application No. 14/354,334, filed as application No. PCT/FR2012/052974 on Dec. 18, 2012, now Pat. No. 9,250,757.

(30) Foreign Application Priority Data

Dec. 22, 2011 (FR) .................................. 11 62246

(51) Int. Cl.
G06F 3/044 (2006.01)
G01R 27/26 (2006.01)
(Continued)

(52) U.S. Cl.
CPC ............ *G06F 3/044* (2013.01); *G01D 5/24* (2013.01); *G01R 27/2605* (2013.01);
(Continued)

(58) Field of Classification Search
CPC ................. G06F 3/044; G06F 3/0416; G06F 2203/04108; G06F 2203/04107; G01D 5/24; G01R 27/2605
See application file for complete search history.

(56) References Cited

U.S. PATENT DOCUMENTS 4,526,043 A 7/1985 Boie
4,571,454 A 2/1986 Tamaru et al.
(Continued)

FOREIGN PATENT DOCUMENTS

CN 1202254 A 12/1998
CN 2012-18943 Y 4/2009
(Continued)

OTHER PUBLICATIONS

International Search Report dated Apr. 16, 2013, corresponding to PCT/FR2012/052974.
(Continued)

*Primary Examiner* — Ibrahim A Khan
(74) *Attorney, Agent, or Firm* — Morrison & Foerster LLP (57) ABSTRACT The present invention relates to a capacitive-measurement device for touch-sensitive and/or contactless interfaces, including at least one capacitive-measurement electrode (1) and electrode-switching means (2) capable of electrically connecting said at least one electrode (1), either to capacitive-measurement means or to a guard potential (11), said at least one capacitive-measurement electrode (1) and said electrode-switching means (2) being provided on a single detection surface (7) according to a technique for manufacturing planar electronic components. The invention also relates to an apparatus implementing the device.

18 Claims, 2 Drawing Sheets (51) Int. Cl.
*G01D 5/24* (2006.01)
*G06F 3/041* (2006.01)

(52) U.S. Cl.
CPC .. *G06F 3/0416* (2013.01); *G06F 2203/04107* (2013.01); *G06F 2203/04108* (2013.01)

(56) References Cited

U.S. PATENT DOCUMENTS

| | | | |
|---|---|---|---|
| 4,686,332 A | 8/1987 | Greanias et al. |
| 4,698,461 A | 10/1987 | Meadows et al. |
| 4,700,022 A | 10/1987 | Salvador et al. |
| 4,922,061 A | 5/1990 | Meadows et al. |
| 5,062,198 A | 11/1991 | Sun |
| 5,083,118 A | 1/1992 | Kazama |
| 5,113,041 A | 5/1992 | Blonder et al. |
| 5,305,017 A | 4/1994 | Gerpheide |
| 5,442,347 A | 8/1995 | Vranish |
| 5,483,261 A | 1/1996 | Yasutake |
| 5,488,204 A | 1/1996 | Mead et al. |
| 5,528,267 A | 6/1996 | Ise |
| 5,543,588 A | 8/1996 | Bisset et al. |
| 5,565,658 A | 10/1996 | Gerpheide et al. |
| 5,648,642 A | 7/1997 | Miller et al. |
| 5,650,597 A | 7/1997 | Redmayne |
| 5,825,352 A | 10/1998 | Bisset et al. |
| 5,835,079 A | 11/1998 | Shieh |
| 5,841,427 A | 11/1998 | Teterwak |
| 5,844,506 A | 12/1998 | Binstead |
| 5,847,690 A | 12/1998 | Boie et al. |
| 5,861,875 A | 1/1999 | Gerpheide |
| 5,869,791 A | 2/1999 | Young |
| 5,880,411 A | 3/1999 | Gillespie et al. |
| 5,889,236 A | 3/1999 | Gillespie et al. |
| 5,914,465 A | 6/1999 | Allen et al. |
| 5,920,309 A | 7/1999 | Bisset et al. |
| 5,942,733 A | 8/1999 | Allen et al. |
| 6,025,647 A | 2/2000 | Shenoy et al. |
| 6,128,045 A | 10/2000 | Anai |
| 6,188,391 B1 | 2/2001 | Seely et al. |
| 6,204,897 B1 | 3/2001 | Colgan et al. |
| 6,232,937 B1 | 5/2001 | Jacobsen et al. |
| 6,236,386 B1 | 5/2001 | Watanabe |
| 6,239,788 B1 | 5/2001 | Nohno et al. |
| 6,297,811 B1 | 10/2001 | Kent |
| 6,310,610 B1 | 10/2001 | Beaton et al. |
| 6,323,846 B1 | 11/2001 | Westerman et al. |
| 6,417,627 B1 | 7/2002 | Derraa |
| 6,452,514 B1 | 9/2002 | Philipp |
| 6,492,979 B1 | 12/2002 | Kent et al. |
| 6,587,358 B1 | 7/2003 | Yasumura |
| 6,690,387 B2 | 2/2004 | Zimmerman et al. |
| 6,847,354 B2 | 1/2005 | Vranish |
| 6,888,536 B2 | 5/2005 | Westerman et al. |
| 6,891,531 B2 | 5/2005 | Lin |
| 6,943,705 B1 | 9/2005 | Bolender et al. |
| 6,970,160 B2 | 11/2005 | Mulligan et al. |
| 7,015,894 B2 | 3/2006 | Morohoshi |
| 7,030,860 B1 | 4/2006 | Hsu et al. |
| 7,098,897 B2 | 8/2006 | Vakil et al. |
| 7,129,935 B2 | 10/2006 | Mackey |
| 7,184,064 B2 | 2/2007 | Zimmerman et al. |
| 7,218,314 B2 | 5/2007 | Itoh |
| 7,236,161 B2 | 6/2007 | Geaghan et al. |
| 7,339,579 B2 | 3/2008 | Richter et al. |
| 7,356,575 B1 | 4/2008 | Shapiro |
| 7,362,313 B2 | 4/2008 | Geaghan et al. |
| 7,372,455 B2 | 5/2008 | Perski et al. |
| 7,382,139 B2 | 6/2008 | Mackey |
| 7,511,702 B2 | 3/2009 | Hotelling |
| 7,532,205 B2 | 5/2009 | Gillespie et al. |
| 7,567,240 B2 | 7/2009 | Peterson et al. |
| 7,570,064 B2 | 8/2009 | Roziere |
| 7,639,238 B2 | 12/2009 | Hauck |
| 7,663,607 B2 | 2/2010 | Hotelling et al. |
| 7,692,729 B2 | 4/2010 | Pak et al. |
| 7,808,255 B2 | 10/2010 | Hristov et al. |
| 7,812,827 B2 | 10/2010 | Hotelling et al. |
| 7,812,828 B2 | 10/2010 | Westerman et al. |
| 7,821,502 B2 | 10/2010 | Hristov |
| 7,825,885 B2 | 11/2010 | Sato et al. |
| 7,825,905 B2 | 11/2010 | Philipp |
| 7,898,122 B2 | 3/2011 | Andrieux et al. |
| 7,920,129 B2 | 4/2011 | Hotelling et al. |
| 7,932,898 B2 | 4/2011 | Philipp et al. |
| 7,948,477 B2 | 5/2011 | Hotelling |
| 8,149,002 B2 | 4/2012 | Ossart et al. |
| 8,159,213 B2 | 4/2012 | Roziere |
| 8,264,428 B2 | 9/2012 | Nam |
| 8,355,887 B1 | 1/2013 | Harding et al. |
| 8,390,582 B2 | 3/2013 | Hotelling et al. |
| 8,479,122 B2 | 7/2013 | Hotelling et al. |
| 8,576,161 B2 | 11/2013 | Chang et al. |
| 8,654,083 B2 | 2/2014 | Hotelling et al. |
| 8,665,237 B2 | 3/2014 | Koshiyama et al. |
| 8,766,950 B1 | 7/2014 | Morein et al. |
| 8,770,033 B2 | 7/2014 | Roziere |
| 8,773,351 B2 | 7/2014 | Rekimoto |
| 8,884,890 B2 | 11/2014 | Hotelling et al. |
| 8,890,850 B2 | 11/2014 | Chung et al. |
| 8,917,256 B2 | 12/2014 | Roziere |
| 9,000,782 B2 | 4/2015 | Roziere |
| 9,035,903 B2 | 5/2015 | Binstead |
| 9,075,491 B2 | 7/2015 | Hotelling et al. |
| 9,117,679 B2 | 8/2015 | Ma |
| 9,151,791 B2 | 10/2015 | Roziere |
| 9,250,757 B2 | 2/2016 | Roziere |
| 9,268,427 B2 | 2/2016 | Yousefpor et al. |
| 9,336,723 B2 | 5/2016 | Gupta et al. |
| 9,423,897 B2 | 8/2016 | Bae |
| 9,442,330 B2 | 9/2016 | Huo |
| 9,448,675 B2 | 9/2016 | Morein et al. |
| 9,465,502 B2 | 10/2016 | Hotelling et al. |
| 9,535,547 B2 | 1/2017 | Roziere |
| 9,640,991 B2 | 5/2017 | Blondin et al. |
| 9,836,160 B2 | 12/2017 | Hotelling et al. |
| 10,007,388 B2 | 6/2018 | Roziere |
| 10,019,103 B2 | 7/2018 | Gupta et al. |
| 2002/0015024 A1* | 2/2002 | Westerman ........... G06F 3/0235 345/173 |
| 2003/0075427 A1 | 4/2003 | Caldwell |
| 2003/0231168 A1 | 12/2003 | Bell et al. |
| 2004/0135773 A1 | 7/2004 | Bang et al. |
| 2004/0243747 A1 | 12/2004 | Rekimoto |
| 2005/0219228 A1 | 10/2005 | Alameh et al. |
| 2005/0270273 A1 | 12/2005 | Marten |
| 2006/0001640 A1 | 1/2006 | Lee |
| 2006/0022956 A1 | 2/2006 | Lengeling et al. |
| 2006/0084852 A1 | 4/2006 | Mason et al. |
| 2006/0092142 A1 | 5/2006 | Gillespie et al. |
| 2006/0097733 A1 | 5/2006 | Roziere |
| 2006/0161871 A1 | 7/2006 | Hotelling et al. |
| 2006/0187214 A1 | 8/2006 | Gillespie et al. |
| 2006/0197753 A1 | 9/2006 | Hotelling |
| 2006/0207806 A1 | 9/2006 | Philipp |
| 2006/0227114 A1 | 10/2006 | Geaghan et al. |
| 2006/0274055 A1 | 12/2006 | Reynolds et al. |
| 2007/0034423 A1 | 2/2007 | Rebeschi et al. |
| 2007/0062739 A1 | 3/2007 | Philipp et al. |
| 2007/0074913 A1 | 4/2007 | Geaghan et al. |
| 2007/0273560 A1 | 11/2007 | Hua et al. |
| 2007/0279395 A1 | 12/2007 | Philipp |
| 2008/0006454 A1 | 1/2008 | Hotelling |
| 2008/0012835 A1 | 1/2008 | Rimon et al. |
| 2008/0042985 A1 | 2/2008 | Katsuhito et al. |
| 2008/0062148 A1 | 3/2008 | Hotelling et al. |
| 2008/0074401 A1 | 3/2008 | Chung et al. |
| 2008/0088595 A1 | 4/2008 | Liu et al. |
| 2008/0100572 A1 | 5/2008 | Boillot |
| 2008/0143683 A1 | 6/2008 | Hotelling |
| 2008/0158167 A1 | 7/2008 | Hotelling et al. |
| 2008/0158182 A1 | 7/2008 | Westerman |
| 2008/0158198 A1 | 7/2008 | Elias |
| 2008/0174321 A1 | 7/2008 | Kang et al. |
| 2008/0180365 A1 | 7/2008 | Ozaki |

(56) References Cited

U.S. PATENT DOCUMENTS

| | | |
|---|---|---|
| 2008/0231292 A1 | 9/2008 | Ossart et al. |
| 2008/0231603 A1 | 9/2008 | Parkinson et al. |
| 2008/0246496 A1 | 10/2008 | Hristov et al. |
| 2008/0284261 A1 | 11/2008 | Andrieux et al. |
| 2008/0303770 A1 | 12/2008 | Oke et al. |
| 2008/0303964 A1 | 12/2008 | Lee et al. |
| 2009/0009485 A1 | 1/2009 | Bytheway |
| 2009/0091546 A1 | 4/2009 | Joo et al. |
| 2009/0141046 A1 | 6/2009 | Rathnam et al. |
| 2009/0174686 A1 | 7/2009 | Jeon et al. |
| 2009/0179868 A1 | 7/2009 | Ayres et al. |
| 2009/0212642 A1 | 8/2009 | Krah |
| 2009/0238012 A1 | 9/2009 | Tatapudi et al. |
| 2009/0251427 A1 | 10/2009 | Hung et al. |
| 2009/0309851 A1 | 12/2009 | Bernstein |
| 2009/0322730 A1 | 12/2009 | Yamamoto et al. |
| 2010/0004029 A1 | 1/2010 | Kim |
| 2010/0007616 A1 | 1/2010 | Jang |
| 2010/0013745 A1 | 1/2010 | Kim et al. |
| 2010/0019779 A1 | 1/2010 | Kato et al. |
| 2010/0031174 A1 | 2/2010 | Kim |
| 2010/0052700 A1 | 3/2010 | Yano et al. |
| 2010/0090964 A1 | 4/2010 | Soo et al. |
| 2010/0097346 A1 | 4/2010 | Sleeman |
| 2010/0123667 A1 | 5/2010 | Kim et al. |
| 2010/0139991 A1 | 6/2010 | Philipp et al. |
| 2010/0149127 A1 | 6/2010 | Fisher et al. |
| 2010/0182018 A1 | 7/2010 | Hazelden |
| 2010/0201635 A1 | 8/2010 | Klinghult et al. |
| 2010/0253638 A1 | 10/2010 | Yousefpor et al. |
| 2010/0265187 A1 | 10/2010 | Chang et al. |
| 2010/0265188 A1 | 10/2010 | Chang et al. |
| 2010/0321305 A1 | 12/2010 | Chang et al. |
| 2010/0328262 A1* | 12/2010 | Huang ............... G06F 3/0416 345/174 |
| 2011/0001491 A1 | 1/2011 | Huang et al. |
| 2011/0006999 A1 | 1/2011 | Chang et al. |
| 2011/0007021 A1 | 1/2011 | Bernstein et al. |
| 2011/0007030 A1 | 1/2011 | Mo et al. |
| 2011/0061949 A1 | 3/2011 | Krah et al. |
| 2011/0080391 A1 | 4/2011 | Brown et al. |
| 2011/0169783 A1 | 7/2011 | Wang et al. |
| 2011/0242027 A1 | 10/2011 | Chang |
| 2011/0298727 A1 | 12/2011 | Yousefpor et al. |
| 2012/0044662 A1 | 2/2012 | Kim et al. |
| 2012/0132006 A1 | 5/2012 | Roziere |
| 2012/0182251 A1 | 7/2012 | Krah |
| 2012/0187965 A1 | 7/2012 | Roziere |
| 2012/0188200 A1 | 7/2012 | Roziere |
| 2012/0188201 A1* | 7/2012 | Binstead ............... G06F 3/041 345/174 |
| 2012/0235949 A1 | 9/2012 | Ligtenberg |
| 2012/0242597 A1 | 9/2012 | Hwang et al. |
| 2012/0274603 A1 | 11/2012 | Kim et al. |
| 2013/0076647 A1 | 3/2013 | Yousefpor et al. |
| 2013/0076648 A1 | 3/2013 | Krah et al. |
| 2013/0106755 A1 | 5/2013 | Hotelling et al. |
| 2013/0135247 A1 | 5/2013 | Na et al. |
| 2013/0141343 A1 | 6/2013 | Yu et al. |
| 2013/0170116 A1 | 7/2013 | In et al. |
| 2013/0181943 A1 | 7/2013 | Bulea et al. |
| 2013/0194231 A1 | 8/2013 | Smith et al. |
| 2013/0285971 A1 | 10/2013 | Eltas et al. |
| 2013/0293499 A1 | 11/2013 | Chang et al. |
| 2013/0307776 A1 | 11/2013 | Roziere |
| 2013/0314393 A1 | 11/2013 | Min et al. |
| 2013/0328795 A1 | 12/2013 | Yao et al. |
| 2013/0328800 A1 | 12/2013 | Pu et al. |
| 2013/0342431 A1 | 12/2013 | Saeedi et al. |
| 2013/0342479 A1 | 12/2013 | Pyo et al. |
| 2014/0028535 A1 | 1/2014 | Min et al. |
| 2014/0043546 A1 | 2/2014 | Yamazaki et al. |
| 2014/0070823 A1 | 3/2014 | Roziere |
| 2014/0078096 A1 | 3/2014 | Tan et al. |
| 2014/0078097 A1 | 3/2014 | Shepelev et al. |
| 2014/0103712 A1 | 4/2014 | Blondin et al. |
| 2014/0111496 A1 | 4/2014 | Gomez et al. |
| 2014/0132335 A1 | 5/2014 | Rauhala et al. |
| 2014/0132534 A1 | 5/2014 | Kim |
| 2014/0132560 A1 | 5/2014 | Huang et al. |
| 2014/0267070 A1 | 9/2014 | Shahparnia et al. |
| 2014/0267165 A1 | 9/2014 | Roziere |
| 2014/0327654 A1 | 11/2014 | Sugita et al. |
| 2015/0035787 A1 | 2/2015 | Shahparnia et al. |
| 2015/0035792 A1 | 2/2015 | Roziere et al. |
| 2015/0084911 A1 | 3/2015 | Stronks et al. |
| 2015/0116243 A1 | 4/2015 | Saitou et al. |
| 2015/0194470 A1 | 7/2015 | Hwang |
| 2015/0277648 A1 | 10/2015 | Small |
| 2016/0034102 A1 | 2/2016 | Roziere et al. |
| 2016/0117017 A1 | 4/2016 | Kremin et al. |
| 2016/0170533 A1 | 6/2016 | Roziere |
| 2016/0211808 A1 | 7/2016 | Lee et al. |
| 2016/0224177 A1 | 8/2016 | Krah |
| 2016/0253034 A1 | 9/2016 | Gupta et al. |
| 2016/0320898 A1 | 11/2016 | Tang |
| 2017/0003817 A1 | 1/2017 | Hotelling et al. |
| 2017/0090644 A1 | 3/2017 | Yao |
| 2017/0108968 A1 | 4/2017 | Roziere |
| 2017/0139539 A1 | 5/2017 | Yao et al. |
| 2017/0168619 A1 | 6/2017 | Yang et al. |
| 2017/0220156 A1 | 8/2017 | Blondin |
| 2017/0262121 A1 | 9/2017 | Kurasawa |
| 2017/0315646 A1 | 11/2017 | Roziere |
| 2017/0351378 A1 | 12/2017 | Wang et al. |
| 2018/0074633 A1 | 3/2018 | Kida |
| 2018/0101275 A1 | 4/2018 | Hotelling et al. |
| 2018/0107309 A1 | 4/2018 | Endo et al. |

FOREIGN PATENT DOCUMENTS

| | | | |
|---|---|---|---|
| CN | 10-2483659 A | 5/2012 | |
| CN | 102 760 405 | 10/2012 | |
| CN | 10-2881839 A | 1/2013 | |
| DE | 11-2012 004912 T5 | 8/2014 | |
| EP | 2 144 146 A1 | 1/2010 | |
| EP | 2 148 264 A2 | 1/2010 | |
| EP | 2 224 277 A1 | 9/2010 | |
| EP | 2 256 606 A2 | 12/2010 | |
| EP | 2 267 791 A2 | 12/2010 | |
| FR | 2756048 | 5/1998 | |
| FR | 2756048 A1 * | 5/1998 | ............ G01B 7/023 |
| FR | 2 896 595 A1 | 7/2007 | |
| FR | 2 949 008 | 2/2011 | |
| FR | 3 004 551 A1 | 10/2014 | |
| JP | H10-505183 A | 5/1998 | |
| JP | 2000-163031 A | 6/2000 | |
| JP | 2002-342033 A | 11/2002 | |
| JP | 2004-526265 A | 8/2004 | |
| JP | 2006-251927 A | 9/2006 | |
| JP | 2008-117371 A | 5/2008 | |
| JP | 2009-086240 A | 4/2009 | |
| JP | 2009-157373 A | 7/2009 | |
| JP | 2011-141464 A | 7/2011 | |
| JP | 2013-109095 A | 6/2013 | |
| KR | 10-2008-0041278 A | 5/2008 | |
| KR | 10-2008-0060127 A | 7/2008 | |
| KR | 10-2010-0054899 A | 5/2010 | |
| KR | 10-2011-0044670 A | 4/2011 | |
| TW | 200508580 A | 3/2005 | |
| TW | 201126236 A | 8/2011 | |
| WO | WO-00/44018 A1 | 7/2000 | |
| WO | WO-2005/073834 A2 | 8/2005 | |
| WO | WO-2005/114369 A2 | 12/2005 | |
| WO | WO-2005/114369 A3 | 12/2005 | |
| WO | WO-2006/126703 A2 | 11/2006 | |
| WO | WO-2007/003108 A1 | 1/2007 | |
| WO | WO-2007/146780 A2 | 12/2007 | |
| WO | WO-2008/000964 | 1/2008 | |
| WO | WO-2008/030780 A1 | 3/2008 | |
| WO | WO-2011/015795 A3 | 2/2011 | |
| WO | WO-2013/093327 A1 | 6/2013 | |
| WO | WO-2014/126661 A1 | 8/2014 | |
| WO | WO-2015/088629 A1 | 6/2015 | |

(56) References Cited

FOREIGN PATENT DOCUMENTS

| WO | WO-2015/175013 A1 | 11/2015 |
| WO | WO-2015/178920 | 11/2015 |
| WO | WO-2016/066282 A1 | 5/2016 |
| WO | WO-2016/126525 A1 | 8/2016 |

OTHER PUBLICATIONS

Final Office Action dated Jan. 15, 2015, for U.S. Appl. No. 14/354,334, filed Apr. 25, 2014, 23 pages.
Non-Final Office Action dated Sep. 16, 2014, for U.S. Appl. No. 14/354,334, filed Apr. 25, 2014, 24 pages.
Notice of Allowance dated Sep. 25, 2015, for U.S. Appl. No. 14/354,334, filed Apr. 25, 2014, seven pages.
Japanese Office Action dated Feb. 9, 2016, for JP Application No. 2015-092901, with English translation, 11 pages.
Non-Final Office Action dated Mar. 17, 2014, for U.S. Appl. No. 13/388,611, filed Apr. 10, 2012, sixteen pages.
Non-Final Office Action dated May 1, 2014, for U.S. Appl. No. 13/388,627, filed Apr. 10, 2012, eight pages.
Non-Final Office Action dated Nov. 2, 2015, for U.S. Appl. No. 14/341,230, filed Jul. 25, 2014, nine pages.
Notice of Allowance dated Nov. 28, 2014, for U.S. Appl. No. 13/388,627, filed Apr. 10, 2012, seven pages.
Notice of Allowance dated Jun. 10, 2015, for U.S. Appl. No. 14/082,678, filed Nov. 18, 2013, seven pages.
Notice of Allowance dated May 9, 2016, for U.S. Appl. No. 14/341,230, filed Jul. 25, 2014, five pages.
French Search Report, dated Mar. 14, 2012, from corresponding FR application.
International Search Report, dated Nov. 27, 2012, from corresponding PCT application.
Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.
Non-Final Office Action dated Mar. 10, 2016, for U.S. Appl. No. 14/126,163, filed Dec. 13, 2013, four pages.
Notice of Allowance dated Aug. 8, 2016, for U.S. Appl. No. 14/126,163, filed Dec. 13, 2013, seven pages.
Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.
Rubine, D.H. (May 1992). "Combining Gestures and Direct Manipulation," CHI '92, pp. 659-660.
Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.
Chinese Search Report dated Apr. 6, 2017, for CN Application No. 201280063934.9, with English translation, four pages.
International Search Report dated Oct. 21, 2015, for PCT Application No. PCT/EP2015/063857, six pages.
Yang, J-H. et al. (Jul. 2013). "A Noise-Immune High-Speed Readout Circuit for In-Cell Touch Screen Panels," *IEEE Transactions on Circuits and Systems—1: Regular Papers* 60(7):1800-1809.
Notice of Allowance dated Jan. 13, 2017, for U.S. Appl. No. 14/126,163, filed Dec. 13, 2013, seven pages.
Chinese Search Report dated Mar. 2, 2018, for CN Application No. 201510863213.1, with English translation, four pages.
Notice of Allowance dated Mar. 14, 2018, for U.S. Appl. No. 15/396,213, filed Dec. 30, 2016, nine pages.
Boie, R.A. (Mar. 1984). "Capacitive Impedance Readout Tactile Image Sensor," *Proceedings of 1984 IEEE International Conference on Robotics and Automation*, pp. 370-378.
Chun, K. et al. (Jul. 1985). "A High-Performance Silicon Tactile Imager Based on a Capacitive Cell," *IEEE Transactions on Electron Devices* 32(7):1196-1201.
Kamba, T. et al. (1996). "Using Small Screen Space More Efficiently," *Proceedings of the SIGCHI Conference on Human Factors in Computing Systems*, Apr. 13-18, 1996, pp. 383-390.
Krein, P. et al. (May/Jun. 1990). "The Electroquasistatics of the Capacitive Touch Panel," *IEEE Transactions on Industry Applications* 26(3):529-534.
Leeper, A.K. (May 21, 2002). "14.2: Integration of a Clear Capacitive Touch Screen with a 1/8-VGA FSTN-LCD to Form and LCD-Based TouchPad," *SID 02 Digest*, pp. 187-189.
Quantum Research Group. (2006). "Design Wins," 25 pages.
Quantum Research Group. (2006). "Qmatrix Technology White Paper," four pages.
Sarma, K. (2004). "Liquid Crystal Displays," Electrical Measurement, Chapter 32 In *Signal Processing and Displays*, CRC Press LLC. pp. 32.1-32.21.
Suzuki, K. et al. (Aug. 1990). "A 1024-Element High-Performance Silicon Tactile Imager," *IEEE Transactions on Electron Devices* 37(8):1852-1860.
Synaptics. (2005). "Transparent Capacitive Position Sensing", located at http://www.synaptics.com/technology/tcps.cfm, last visited Sep. 16, 2011, two pages.

\* cited by examiner

SWITCHED-ELECTRODE CAPACITIVE-MEASUREMENT DEVICE FOR TOUCH-SENSITIVE AND CONTACTLESS INTERFACES

CROSS REFERENCES TO RELATED APPLICATIONS

This application is a continuation of U.S. application Ser. No. 14/354,334, filed Apr. 25, 2014 and published on Sep. 18, 2014 as U.S. Publication No. 2014-0267165, the contents of which are incorporated herein by reference in its entirety for all purposes.

TECHNICAL FIELD

The present invention relates to a capacitive measurement device for producing touch-sensitive and contactless human-machine interfaces, which allows an optimal integration of a large number of measurement electrodes on a detection surface.

The field of the invention is more particularly but is non-limitatively that of touch-sensitive and contactless human-machine interfaces.

STATE OF THE PRIOR ART

Many devices used for communication and for work use a touch-sensitive or contactless command interface such as a pad or a screen. This type of interface can be found for example in mobile telephones, smartphones, computers with touch-sensitive screens, pads, PCs, mouse devices, touch pads and widescreens etc.

These interfaces frequently use capacitive technologies. The touch surface is equipped with conductive electrodes connected to electronic means which make it possible to measure the variation of the capacitances appearing between the electrodes and the object to be detected in order to carry out a command.

It is possible to provide transparent electrodes which make it possible to superimpose an interface onto a display screen, for example of a smartphone.

Most of these interfaces are touch-sensitive, that is they can detect contact between one or more command object(s) (usually the fingers) and the surface of the interface. Gestural or contactless interfaces are increasingly being developed which are capable of detecting command objects which are further from the interface, without contact with the surface.

The capacitive techniques currently implemented in touch-sensitive interfaces most frequently use two layers of conductive electrodes in the form of rows and columns. The electronics measure the coupling capacitances existing between these rows and columns. When a finger is very close to the active surface, the coupling capacitances close to the finger are altered and the electronics can thus locate the 2D position (XY) in the plane of the active surface.

These technologies, often called "mutual capacitance", make it possible to detect the presence and the position of the finger through a thin dielectric. They have the advantage of enabling a very good resolution in the location in the plane (XY) of the touch surface of one or more fingers. With appropriate processing software, it is also possible to manage a large number of fingers if the surface of the interface is large enough.

However, these techniques have the drawback of generating on principle large leakage capacitances at the level of the measurement electrodes and of the electronics. In fact the detection of a finger is achieved by measuring the variation in the coupling capacitance created between each row and column of which one is the emitter of an electrical signal and the other is a receiver of the signal to be detected. This signal is proportional to the capacitance between the row and column selected. When a finger is very close to the intersection of the row and column in question, the coupling capacitance is reduced and the finger is detected.

These coupling capacitances, which can be significant even in the absence of the object to be detected, can also drift over time due to ageing, deformation of the materials, or the effect of the variation of the surrounding temperature. These variations can degrade the sensitivity of the electrodes, or can even trigger commands in an untimely manner. This is one of the reasons why these technologies can only detect contact with the finger and not its approach because it is necessary to create a large variation in the capacitance to enable the electric circuit to detect the variation which must be much larger than the drifts to avoid any [capacitance] artefact.

Techniques are also known which make it possible to measure the absolute capacitance which appears between the electrodes and an object to be detected. These techniques are often called "self capacitance". Document FR 2 756 048 by Rozière is known for example, which discloses a method of capacitive measurement which makes it possible to measure the capacitance and the distance between a plurality of independent electrodes and a nearby object.

This technology uses a guard in order to eliminate all stray capacitance. All the electrodes have the same potential and there is therefore no coupling capacitance between the electrodes that is capable of degrading the capacitance measurement. This technology is well suited to touch-sensitive and contactless interfaces such as capacitive pads and transparent touchpads and/or small 3D screens, such as the pads of portable computers or the small screens of smartphones. On the other hand, when the pad or the screen is of greater size, the number of electrodes necessary to cover the entire touch surface is too large to be managed by a miniature electronic circuit. And above all, the surface at the periphery of the touch surface and between the electrodes which is necessary for the passage of the tracks connecting the electrodes to the electronics also becomes very significant.

With this technique it is possible to use electrodes in the form of rows and columns in order to minimize interconnection problems. This row-column structure, in which rows and columns are used as independent electrodes, makes contactless or gestural measurement over long distances possible (detection of a finger several centimeters away) but another problem appears when more than one object is to be detected. In fact, it is necessary to scan each row and each column which produces a measurement for virtual objects called ghosts. These ghosts prevent a number of objects from being located absolutely on the touch surface.

The purpose of the present invention is to propose a capacitive measurement device for touch-sensitive and/or contactless interfaces which makes it possible to implement a high number of capacitive measurement electrodes on a detection surface while limiting interconnection problems of these electrodes with the measurement electronics.

DISCLOSURE OF THE INVENTION

This objective is achieved with a capacitive measurement device for touch-sensitive and/or contactless interfaces comprising at least one capacitive measurement electrode and means of electrode switching capable of electrically connecting said at least one electrode, either to capacitive measurement means or to a guard potential, characterized in that said at least one capacitive measurement electrode and said means of electrode switching are produced on a single detection surface according to a manufacturing technique for electronic components of planar type.

Manufacturing techniques for electronic components of planar type can comprise in particular techniques originating from microelectronics. They can comprise, but are not limited to, layer deposition operations, in particular of thin layers, evaporation, masking, chemical etching, dry etching, ion implantation, deposition of products in solution, inkjet printing etc.

The device according to the invention can comprise moreover:
- a plurality of capacitive measurement electrodes distributed over a detection surface according to a two-dimensional structure with two intersecting directions,
- means of electrode switching placed nearby said measurement electrodes on the detection surface,
- first electrical connection tracks arranged on the detection surface in such a way as to be capable of connecting to the capacitive measurement means via their respective means of electrode switching, a plurality of measurement electrodes distributed approximately in a first direction, and
- second electrical connection tracks arranged on the detection surface in such a way as to be capable of connecting, on a switching signal, the respective means of electrode switching of a plurality of measurement electrodes distributed approximately in the second direction.

The capacitive measurement electrodes can in particular be distributed on the detection surface following a matrix structure approximately in rows and columns According to embodiments, the device according to the invention can comprise moreover:
- a guard plane in an appreciably electrically conductive material, at the electrical guard potential, arranged below the measurement electrodes and separated from said electrodes by at least one layer of an appreciably electrically insulating material;
- means of electrode switching connected electrically to the guard plane by electrical connections passing through the layer(s) of appreciably insulating material.

The means of electrode switching can comprise two transistors, of which a first transistor is capable of connecting a measurement electrode to the capacitive measurement means and a second transistor is capable of connecting said measurement electrode to the guard potential, which transistors are controlled by a switching signal such that when one is on-state the other is off-state.

According to embodiments, the device according to the invention can comprise moreover:
- transistors produced according to a thin layer deposition technology;
- transistors which are substantially transparent;
- transistors of one of the following types: TFT (Thin-Film Transistor) type field-effect transistor, OFET (organic field-effect transistor) type transistors based on organic semiconductors.

According to embodiments, the device according to the invention can be produced in such a way as to be substantially transparent.

It can comprise at least one element among measurement electrodes, a guard plane and tracks comprising ITO (tin-doped indium oxide).

According to embodiments, the device according to the invention can comprise moreover second switching means capable of connecting the means of electrode switching either to capacitive measurement means or to a guard potential.

According to embodiments, the device according to the invention can comprise moreover capacitive measurement means at least in part referenced to a reference electrical potential which is floating with respect to earth potential.

The reference electrical potential can be approximately equal to the guard potential. According to another aspect, a human-machine interface device is proposed comprising a command interface and a capacitive measurement device according to the invention.

The human-machine interface device can comprise a command interface equipped with a display screen, and a capacitive measurement device which is substantially transparent.

According to yet another aspect, a device is proposed of one of the following types: smartphone, tablet, display screen, computer, control pad for a machine or vehicle, comprising a human-machine interface device according to the invention.

Thus, according to the particularly advantageous aspects, the invention makes it possible to provide measurement devices:
- which make it possible to implement independent capacitive measurement electrodes which can measure multiple objects without problems of ghost measurements, whilst minimizing the surface utilized by the electrical connection tracks since one track between the rows or the columns of measurement electrodes is sufficient. The solution of the invention thus makes it possible to optimize the number and/or the surface of the measurement electrodes. It is also possible to make the tracks wider and more remote from the electrodes, which makes it possible to reduce their resistivity (which may not be negligible when using materials such as ITO) and to limit the parasitic effects resulting from flows between tracks and adjacent electrodes.

DESCRIPTION OF THE FIGURES AND EMBODIMENTS

Other advantages and features of the invention will become apparent on reading the detailed description of implementations and embodiments which are in no way limitative, and from the following attached drawings:

FIGS. 1, 2 and 3 are illustrative diagrams from which no scale or proportions can be deduced.

An example of an embodiment of a device according to the invention will be described which makes it possible to manufacture touch-sensitive and contactless interfaces for systems or devices such as mobile telephones (smartphones), tablets, computers or control pads.

Figure 1:
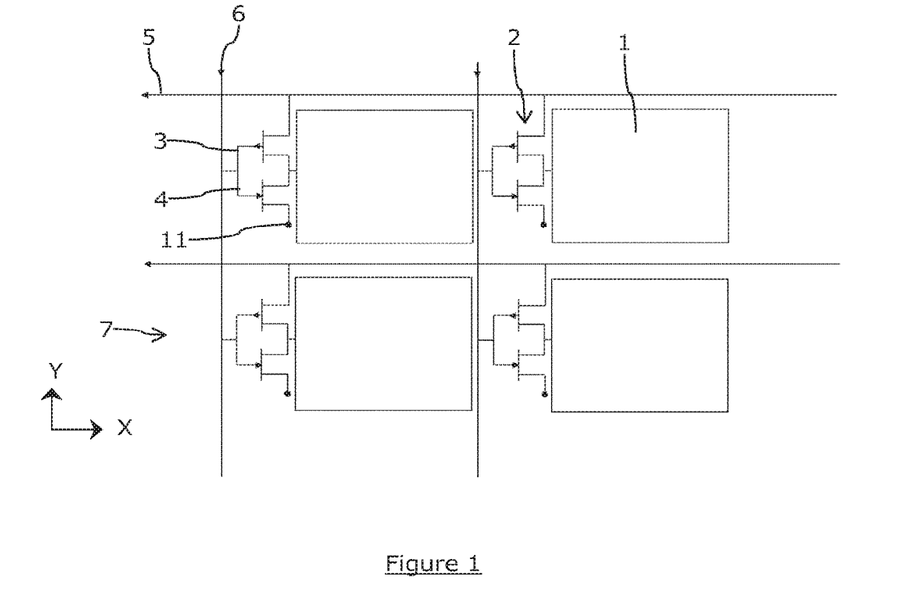
FIG. 1 shows a top view of a capacitive measurement device according to the invention.
Figure 2:
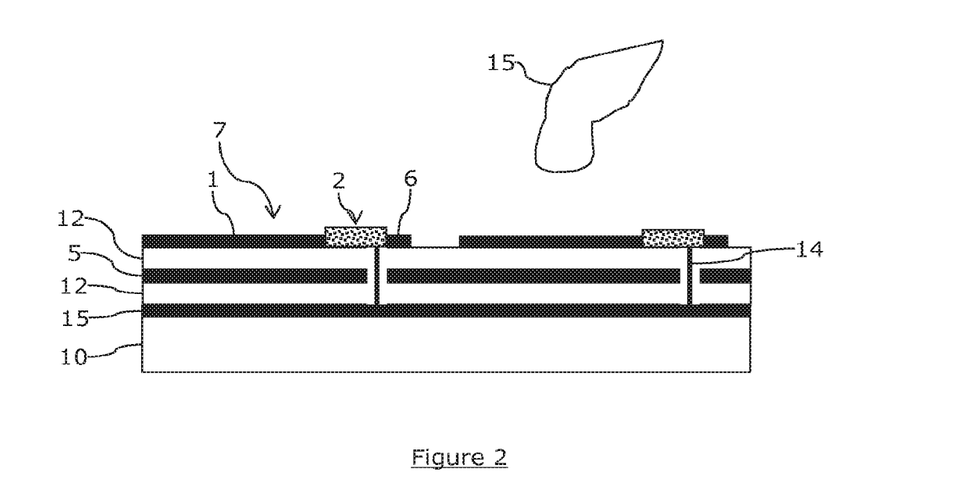
FIG. 2 shows a cross-sectional view of the capacitive measurement device of FIG. 1.

With reference to FIGS. 1 and 2, the measurement device according to the invention comprises a plurality of capacitive measurement electrodes 1 distributed on a detection surface 7 according to a matrix structure in rows and columns, corresponding to two intersecting directions X, Y.

The detection surface 7 constitutes the surface of a command interface 10 which comprises a display screen, for example of the TFT (Thin-Film Transistor) type or OLED (organic light-emitting diodes) type.

The command interface 10 and the superimposed capacitive measurement device constitute a human-machine interface for the system.

The electrodes 1 make it possible to detect the approach and/or contact of one or more object(s) of interest 15 such as a finger 15 by measuring the capacitive coupling which is established between them and the finger 15.

The distance between the finger 15 and the electrodes 1 can be deduced from measuring the capacitive coupling, while the location of the finger 15 in the plane (X, Y) of the detection surface 7 can be obtained from the location of the electrodes 1 which detect the presence of the finger 15.

Figure 3:
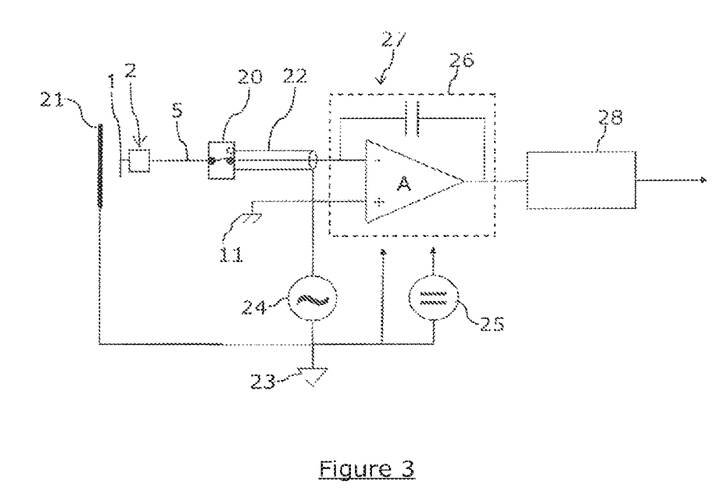
FIG. 3 shows an embodiment of capacitive measurement electronics implemented in the capacitive measurement device of FIGS. 1 and 2.

With reference to FIG. 3, the capacitive coupling is measured by the electronic capacitive measurement means 27.

The electrodes 1 are connected to the means of electrode switching 2 which make it possible to connect them:
either to the electronic capacitive measurement means 27 via the first electrical connection tracks 5, or measurement tracks 5,
or to a guard potential 11.

The means of electrode switching 2 are controlled by a switching signal to which they are connected by the second electrical connection tracks 6, or switching tracks 6.

The measurement tracks 5 connect the electrodes 1 distributed according to a direction X of the matrix, and the switching tracks 6 connect the electrodes 1 distributed according to a second direction Y of the matrix.

The device also comprises a guard plane 15 at an electrical guard potential 11, which is placed below the electrodes 1 opposite their detection surface. This guard plane 15 forms an electrical shielding which protects the electrodes from the influence of the command interface 10.

The assembly is formed according to a multilayer structure with:
a first layer comprising the electrodes 1, the measurement tracks 5 and the means of electrode switching 2,
a second layer comprising the switching tracks 6, and
a third layer comprising the guard plane 15.

The layers are separated by layers of insulating material 12.

The switching means are connected to the guard potential 11 by passing through connections 14 connected to the guard plane 15.

The electrodes 1, the guard plane 15 and the tracks 5, 6 are made from a material which is substantially transparent such as ITO (tin-doped indium oxide) deposited for example by evaporation under vacuum onto the underlying insulating dielectric layer.

The surface of the command interface 10 can be made of glass or a polymer such as PET.

The layers of insulating material 12 are made of a polymer material.

The switching means 1 comprise two transistors of the field-effect type 3, 4, one of which is set to channel N and the other is set to channel P:
the gate of the two transistors 3, 4 is connected to a switching track 6 which conveys the switching signal,
a first transistor 3 is connected by its two other terminals (drain and source) respectively to a measurement track 5 and to electrode 1,
a second transistor 4 is connected by its two other terminals (drain and source) respectively to the guard potential 11 and to electrode 1.

Depending on the polarity and/or the level of the switching signal, one of the transistors 3, 4 is on-state with a very low electrical resistance while the other is off-state with a very high electrical resistance, and vice versa. Thus, the electrode 1 is always connected either to a measurement track 5 or to the guard potential 11.

The transistors 3, 4 are produced using a technique which makes it possible to produce transistors which are substantially transparent to the human eye. Thus, the whole capacitive measurement device is sufficiently transparent to be able to be superimposed on a display screen.

Two known families of techniques are suitable for producing the transistors 3, 4 in the embodiment presented: TFT type transistors (Thin-Film Transistors) or OFET type transistors (field-effect transistors made from organic semiconductors). In both cases the electrodes can be made from ITO.

The TFT type transistors are based on thin layers of silicon depositions. This is a very common technique for producing display screens but it has the drawback, at least for certain embodiments, of requiring operations at high temperature.

OFET type transistors are made from organic semiconductors using structures which are often similar to those of TFT transistors. They can, for example, utilize an organic polymer such as polymethyl methacrylate (PMMA) as gate dielectric.

OFET type transistors can be produced using well known techniques of evaporation under vacuum, by deposition from polymer solutions, by mechanical transfer or even by inkjet printing techniques. Therefore they have the advantage of being able to be produced using low cost techniques at ambient temperature.

The measurement electrodes 1 are connected to the electronic capacitive measurement means 27 via the measurement tracks 5.

These electronic capacitive measurement means 27, in the embodiment in FIG. 3, are produced in the form of a floating capacitive measuring bridge system as described for example in document FR 2 756 048 by Rozière.

The detection circuit comprises a part known as a floating part 26 the reference potential 11 of which, called guard potential 11, oscillates with respect to the earth 23 of the overall system. The alternating potential difference between the guard potential 11 and the earth 23 is generated by an excitation source, or an oscillator 24. The floating part 26 comprises the sensitive part of the capacitive detection, represented in FIG. 3 by a charge amplifier. It can also be understood to comprise other means of processing and conditioning the signal, including digital means or microprocessor based means, also referenced to the guard potential 11. These means of processing and conditioning make it possible, for example, to calculate data relating to distance and pressure from capacitive measurements.

The power supply of the floating part 26 is ensured by floating power transfer means 25, comprising for example DC/DC converters.

This capacitive measurement system makes it possible to measure capacitance data between a measurement electrode 1 and an object such as a finger 15.

The object to be detected 15 must be connected to a potential which is different from the guard potential 11, such as for example the earth potential 23. A finger 15 of a user, whose body defines an electrical earth, is useful in this configuration.

An array of switches or analogue switches 20, controlled by the electronic control means, makes it possible to select a measurement track 5. It can potentially select all the electrodes 1 in one row in the embodiment in FIG. 1.

The switches 20 are configured in such a way that a measurement track 5 is connected either to the capacitive detection electronics 27, or to the guard potential 11.

The selection of a particular electrode 1 connected to this measurement track 5 can be carried out by sending a switching signal on the corresponding switching track 6 so as to configure the means of electrode switching 2 of the electrode 1 to connect it to the measurement track 5.

Thus it is possible to connect only a single electrode 1 to the capacitive detection electronics 27 in order to measure the coupling capacitance between it and the object 15.

Thus all the electrodes can be "interrogated" sequentially and individually. It is also possible to interrogate groups of electrodes 1 globally by activating several switching signals and/or by implementing several detection electronics 27.

The electrodes 1 which are not connected to the capacitive detection electronics 27 are all connected to the guard potential 11, either by the means of electrode switching 2, or by the switches 20.

The sensitive part of the detection is protected by a guard shielding 22 connected to the guard potential 11.

Thus, an active electrode 1 connected to the capacitive detection electronics 27 is surrounded by elements connected to the guard potential 11, including the inactive electrodes 1 and on its rear face the guard plane 15.

As the active measurement electrode 1 is also at the guard potential 11, it is therefore possible to avoid stray capacitances between this electrode 1 and its surroundings in such a way that only the coupling with the object of interest 15 is measured with a maximum sensitivity.

The floating electronics 26 are connected at the output to the system electronics 28 referenced to earth 23 by electrical connections which are compatible with the difference in reference potentials. These connections can comprise for example differential amplifiers or optocouplers.

Data about the position of the object or the objects 15 in space relative to the detection surface 7 are obtained in this way.

These data are processed by the detection electronics 27 and transmitted to the system electronics 28 to be utilized in particular in the human-machine interface. According to variants:

- the capacitive measurement device can be produced by different layered structures, of which in particular (i) the switching tracks 6 are on the same layer as the electrodes 1 and the measurement tracks 5 are on a second layer, or (ii) the switching 6 and measurement 5 tracks are on the same layer with, or without, the electrodes 1, and with electrical connection bridges at the crossing points;
- the device can comprise guard tracks which make it possible to connect the means of electrode switching 2 to the guard potential 11 at the edge of the detection surface, optionally without through connections 14;
- the means of electrode switching 2, of which in particular the transistors 3, 4, can be produced on a different layer from the electrodes 1. They can be placed below the electrodes 1 in order to optimize the surface available for detection;
- the means of electrode switching 2 can be grouped together in particular areas of the detection surface 7 (edges, areas in which it is possible to utilize transistors which are not transparent);
- the capacitive measurement device can be produced with metal electrodes and/or a metal guard plane and/or non-transparent opaque transistors (FET, MOSFET, etc.), in particular for applications where an underlying display is not envisaged.

Of course, the invention is not limited to the examples which have just been described and numerous adjustments can be made to these examples without exceeding the scope of the invention.

The invention claimed is:

1. A measurement device, comprising:
a plurality of capacitive measurement electrodes;
a plurality of electrode switches coupled to the plurality of capacitive measurement electrodes;
an excitation source for generating a guard potential; and
one or more capacitive detection circuits for receiving the guard potential and generating a first AC potential referenced to the guard potential;
wherein the plurality of electrode switches are configurable to enable a first set of one or more of the capacitive measurement electrodes to be selectively coupled to the one or more capacitive detection circuits and coupled for receiving the first AC potential, and to simultaneously enable a second set of one or more of the capacitance measurement electrodes to be selectively coupled for receiving the guard potential, the guard potential different from an earth potential.

2. The measurement device of claim 1, wherein the plurality of electrode switches are further configurable to enable the first set of one or more capacitive measurement electrodes to be additionally coupled to the guard potential.

3. The measurement device of claim 2, wherein the first set of one or more capacitive measurement electrodes are coupled to the guard potential via the one or more capacitive detection circuits.

4. The measurement device of claim 3, wherein at least one of the capacitive detection circuits comprises a charge amplifier having its positive input coupled to the guard potential and its negative input coupled to at least one of the capacitive measurement electrodes, the negative input for providing the guard potential to the at least one capacitive measurement electrode.

5. The measurement device of claim 1, further comprising a guard plane formed below the plurality of capacitive measurement electrodes.

6. The measurement device of claim 1, wherein the plurality of electrode switches are further configurable to selectively couple the capacitive measurement electrodes to the one or more capacitive detection circuits via one or more measurement tracks.

7. The measurement device of claim 1, further comprising one or more second switches coupled to the plurality of electrode switches, the one or more second switches selectively couplable to the guard potential or to the one or more capacitive detection circuits.

8. The measurement device of claim 7, wherein the one or more second switches are further selectively configurable to sequentially and individually couple each of the plurality of capacitive measurement electrodes to the one or more capacitive detection circuits.

9. The measurement device of claim 7, wherein the one or more second switches are further selectively configurable to sequentially couple groups of two or more of the plurality of capacitive measurement electrodes to the one or more capacitive detection circuits.

10. The measurement device of claim 7, wherein the one or more second switches are selectively couplable to the one or more capacitive detection circuits via one or more lines at least partially enclosed by a guard shield held at the guard potential.

11. A method for capacitive touch or proximity measurement, comprising:
    generating a guard potential;
    generating a first AC potential from the guard potential, the first AC potential referenced to the guard potential;
    selectively coupling a first set of one or more capacitive measurement electrodes for receiving the first AC potential and to one or more capacitive detection circuits for touch or proximity measurement; and
    simultaneously coupling a second set of one or more of the capacitance measurement electrodes for receiving the guard potential to minimize stray capacitance, the guard potential different from an earth potential.

12. The method of claim 11, further comprising selectively coupling the first set of one or more capacitive measurement electrodes to the guard potential.

13. The method of claim 11, further comprising shielding the first and second sets of capacitance measurement electrodes using a guard plane.

14. The method of claim 11, further comprising sequentially and individually coupling each of the plurality of capacitive measurement electrodes to the one or more capacitive detection circuits.

15. The method of claim 11, further comprising sequentially coupling groups of two or more of the plurality of capacitive measurement electrodes to the one or more capacitive detection circuits.

16. The method of claim 11, further comprising shielding the coupling between the first set of one or more capacitive measurement electrodes and the one or more capacitive detection circuits.

17. A method for capacitive touch or proximity measurement, comprising:
    generating a guard potential;
    generating a first AC potential from the guard potential, the first AC potential referenced to the guard potential;
    obtaining capacitive touch or proximity measurements from a first set of one or more capacitive measurement electrodes in an array of capacitive measurement electrodes, the first sent of one or more capacitive measurement electrodes receiving the first AC potential;
    simultaneous with the obtaining of the capacitive touch or proximity measurements from the first set of one or more capacitive measurement electrodes, coupling other capacitive measurement electrodes in the array of capacitance measurement electrodes to the guard potential to minimize stray capacitance, the guard potential different from an earth potential.

18. The method of claim 17, further comprising simultaneous with the obtaining of the capacitive touch or proximity measurements from the first set of one or more capacitive measurement electrodes and the coupling of other capacitive measurement electrodes in the array of the capacitance measurement electrodes to the guard potential, shielding all of the capacitive measurement electrodes in the array of capacitive measurement electrodes using a plane held at a guard potential.

* * * * *